United States Patent [19]

Pankove

[11] 3,790,853

[45] Feb. 5, 1974

[54] SEMICONDUCTOR LIGHT RAY DEFLECTOR

[75] Inventor: Jacques Isaac Pankove, Princeton, N.J.

[73] Assignee: RCA Corporation, New York, N.Y.

[22] Filed: Jan. 19, 1973

[21] Appl. No.: 325,074

[52] U.S. Cl.... 317/235 R, 317/235 N, 317/235 AJ, 317/235 AY, 250/211 J, 350/175

[51] Int. Cl. .......... H01l 15/00

[58] Field of Search... 317/235 N, 235 AJ, 235 AY; 350/DIG. 2; 250/211 J

[56] References Cited

UNITED STATES PATENTS

| | | | |
|---|---|---|---|
| 2,929,923 | 3/1960 | Lehovec | 250/7 |
| 3,525,024 | 8/1970 | Kawaji | 317/234 |
| 3,442,722 | 5/1969 | Bauerlein | 148/178 |
| 3,296,502 | 1/1967 | Gross | 317/234 |

*Primary Examiner*—Martin H. Edlow

*Attorney, Agent, or Firm*—Glenn H. Bruestle; Donald S. Cohen

[57] ABSTRACT

A semiconductor light ray deflector is presented which provides for the deflection of rays of light due to changes in the refractive index within a semiconductor caused by modulation of the distribution of excess carriers in the semiconductor.

8 Claims, 6 Drawing Figures

SEMICONDUCTOR LIGHT RAY DEFLECTOR

BACKGROUND OF THE INVENTION

The present invention relates to a semiconductor light ray deflector, and more particularly relates to a semiconductor light ray deflector in which light ray deflection is accomplished by modulation of the distribution of excess carriers.

In the past, semiconductors have been used to alter the characteristics of light transmitted through them by various means other than that which is herein presented. For example, the prior art recognizes that the properties of the space charge layer surrounding a PN junction can be utilized as a variable reflecting layer. This is done by varying the edge of the space charge layer from several tens of microns to a fraction of a micron by means of a variable electrical bias across the junction. The boundary of the space charge layer effectively forming a partially reflective mirror whose position can be rapidly varied. This type of light modulation can be found in U. S. Pat. No. 3,454,843 to Fulop et al.

SUMMARY OF THE INVENTION

A semiconductor light ray deflector is presented which comprises a block of semiconductor material which is transparent to light, the block having two opposite faces through which light can be transmitted, and means for introducing a controllable distribution of excess free carriers within the block of semiconductor material.

DETAILED DESCRIPTION

Figure 1:
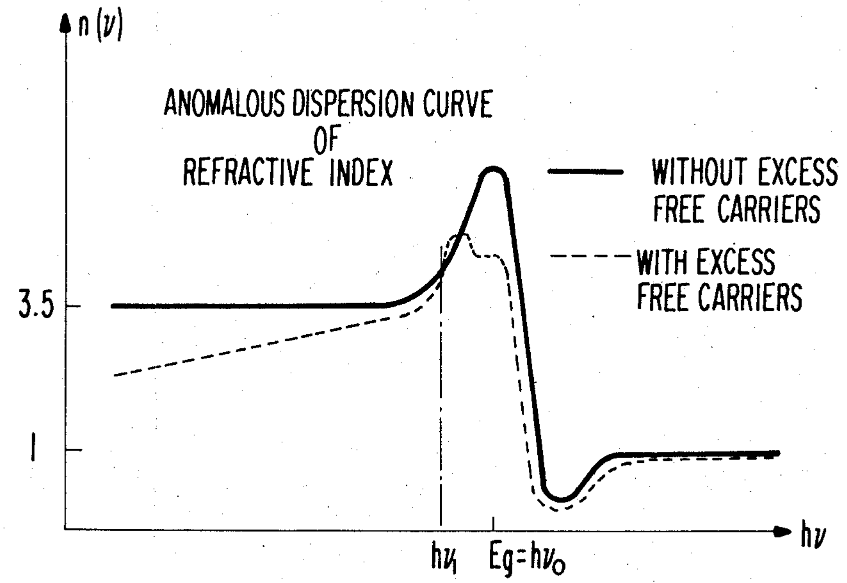
FIG. 1 is the Anomalous Dispersion Curve of Refractive Index relating the refractive index of a semiconductor material to the photon energy of a light ray passing through the material.

The injection of free carriers in a semiconductor changes its index of refraction. Free carriers can either increase or decrease the refractive index of a semiconductor depending on the wavelength or frequency of the light ray traversing the semiconductor. Free carriers can be generated by injection, by electron bombardment, or by optical excitation. Excess electron-hole pairs increase the refractive index in the vicinity of the absorption edge, i.e., in the region corresponding to the energy gap of the particular semiconductor material, where the free carriers cause the absorption coefficient to decrease. The refractive index, $n(\nu)$, decreases elsewhere in the spectrum. The dependence of the refractive index on photon frequency and on the presence of excess carriers is illustrated in FIG. 1 for gallium arsenide, GaAs. For GaAs, the energy gap, Eg is about 1.4 EV.

In a semiconductor laser, population inversion changes the sign of the absorption coefficient in a spectral region very close to the energy gap, transforming the optical loss into optical gain. When this effect is entered into the Kramers-Kroenig relation between refractive index and absorption coefficient, it becomes evident that there is a narrow range of photon frequencies where the refractive index increases. This effect accounts for the confinement of radiation in semiconductor lasers. On the other hand, the Kramers-Kroenig relation states that the refractive index decreases at lower photon frequencies because of the increased contribution of free carrier absorption. At photon frequencies higher than the absorption edge, the effect on the refractive index is of no consequence to the present invention because the semiconductor is too absorbing to transmit light. However, at the higher photon energies, the refractive index will affect the reflection coefficient—an effect which is not utilized in the present invention.

In the present invention, the propagation of a light beam is controlled by modulating the configuration of the boundary between regions of different refractive indices within the semiconductor crystal. As will be seen, this modulation can be accomplished through the use of either an injecting electrode, an electron beam, or a light beam projected upon the semiconductor crystal. In any case, it is possible to define the boundary of the region containing a high concentration of excess electron-hole pairs. This boundary is determined by the current through the injecting electrode, by the cross-sectional shape of the incident electron beam, or by the cross-sectional configuration of the exciting light beam. The light propagating through the region of high excess carrier density emerges from the plasma through a variable boundary between regions of different refractive indices. As will be seen, the resulting refraction may be used as a lens to tilt the light rays, i.e., to deflect, focus, or defocus a light beam, in accordance with Snell's law which states that the ratio of the sine of the angle of incidence between a light ray and the normal to the boundary to the sine of the angle of refraction between the light ray and the normal equals the ratio of refractive indices on either side of the boundary.

Figure 2:
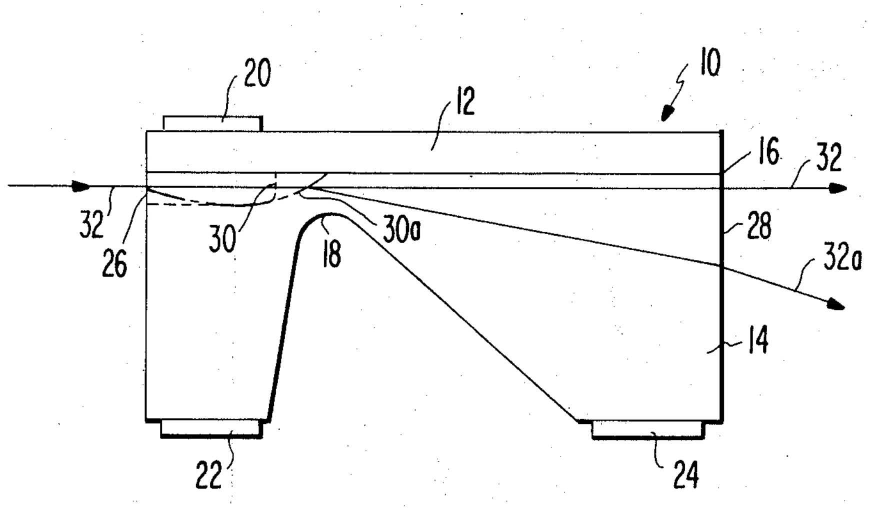
FIG. 2 is a side plan view of one embodiment of the light ray deflector of the present invention.

Referring generally to FIG. 2, one embodiment of a semiconductor light beam deflector 10 is shown. This semiconductor light beam deflector 10 comprises a semiconductor having a P type region 12, an N type region 14, and a PN junction 16 interposed between the P type region 12 and the N type region 14. A groove 18 extends into the N type region 14. A contact electrode 20 is mounted upon the P type region 12, and two more contact electrodes 22, 24 are mounted on the N type region 14 on either side of the groove 18. The semiconductor light ray deflector 10 has a target face 26 and a transmission face 28 through which light is respectively introduced and excited from the ray deflector 10. When a current flows through the ray deflector 10 from the contact electrode 20 to the contact electrode 22, a concentration of excess carrier density 30 will be established around the PN junction 16 in the N type region 14 causing a like gradient of index of refraction. If a light ray 32 of frequency below $\nu_1$ is introduced into the ray deflector 10 through its target face 26, in a plane with and just below the PN junction 16, the ray 32 will pass through the concentration of excess carrier density 30 and the corresponding gradient of the index of refraction and will be deflected, according to Snell's law, upon passing through the concentration of excess carrier density 30.

If the current introduced into contact electrode 20 remains constant while a current is drawn through the contact electrode 24, the current going out of the contact electrode 22 will be decreased in favor of a corresponding increasing current through contact electrode 24. This causes the concentration of excess carrier density 30 to shift toward the modulating contact electrode 24. This will cause a redistribution of the excess carrier density 30*a* to be established within the N type region 14. The gradient of the index of refraction will thus be shifted and the light ray 32*a* will be deflected. The deflection of the light ray 32*a* will vary in accordance with the amount of current withdrawn from the modulating contact electrode 24.

Figure 3A:
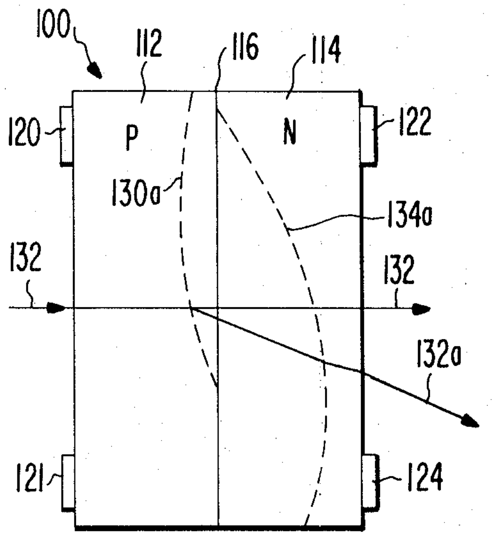
FIGS. 3*a* and 3*b* are side plan views of another embodiment of the light ray deflector of the present invention.
Figure 3B:
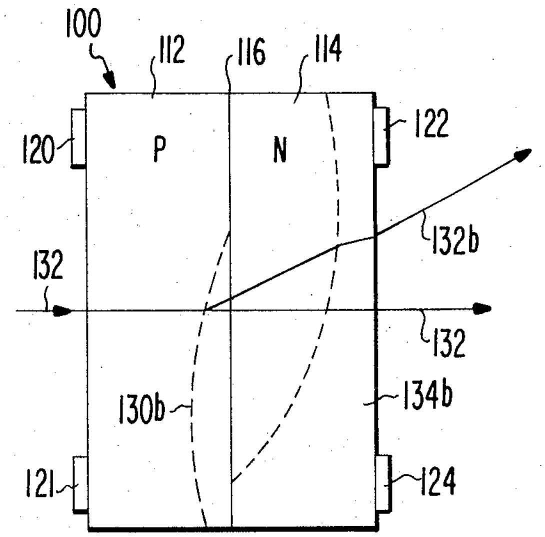

Referring generally to FIGS. 3*a* and 3*b*, a second embodiment of a ray deflector 100 is shown. This embodiment 100 comprises a layer of lightly doped P type material 112 having two contact electrodes 120, 121 thereon, a layer of N type material 114 having two contact electrodes 122, 124 thereon, and a PN junction 116 between the P type and N type layers 112, 114. In the operation of this embodiment 100, a light ray 132 is imposed upon the deflector 100 transverse to the PN junction 116. If a current is then imposed upon the deflector through electrodes 120 and 124, a concentration of excess free carriers 130*a* will be established within the P type layer 112 and a second concentration of excess free carriers 134*a* will be established within the N type layer 114. This will cause the deflection of the light ray 132*a* for the reasons previously described. This embodiment 100 can be modulated by switching all or part of the current flow to the remaining electrodes 121, 122. As shown in FIG. 3b, if all of the current flow is switched to electrodes 121 and 122, a new distribution of excess free carriers 130*b* in the P type region 112 will be established and a new distribution of excess free carriers 134*b* in the N type region 114 will be established. This will cause the deflection of the light ray 132*b*. Thus, by switching all or part of the current flow between one of the electrodes 120, 121 mounted on the P type layer 112 and by switching all or part of the current flow between the electrodes 122, 124 mounted on the N type layer 114, ray deflection is achieved. In particular, the light ray 132 can have a maximum deflection upward or downward by establishing the current flow diagonally through the ray deflector 100 as shown in FIGS. 3*a* and 3*b*. Maximum downward deflection will be achieved by flowing all current between electrodes 120 and 124 as shown in FIG. 3*a*, and maximum upward ray deflection will be achieved by flowing all current between electrodes 121 and 122 as shown in FIG. 3*b*.

Figure 4A:
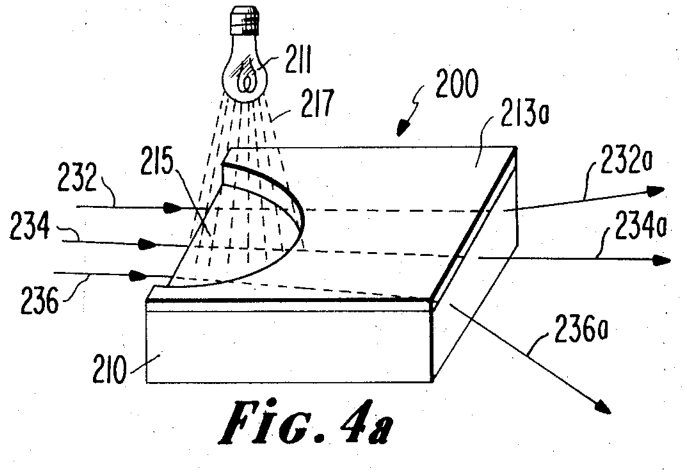
FIGS. 4*a* and 4*b* are perspective views of still another embodiment of the light ray deflector of the present invention.

Referring generally to FIG. 4*a*, a third embodiment of a semiconductor light ray deflector 200 is shown. The ray deflector 200 consists of a block of transparent semiconductor material 210 such as silicon, germanium, a II-VI compound, or a III-V compound. This embodiment 200 further comprises a generator of electronhole pair excitation 211 such as a beam of light 217 whose photons have an energy greater than the semiconductor energy gap or a beam of energetic electrons, and a mask 213 which is opaque to the energy of the excitation generator 211 interposed between the excitation source 211 and the ray deflector 200. In the operation of this embodiment 200, an area of excitation 215 will be established corresponding to that portion of the exciting incidient beam 217 which is not shielded from the semiconductor material 210 by the mask 213. Due to the excitation, an excess carrier concentration will be established within the ray deflector 200 duplicating the mask configuration. For radiation having photon frequencies lower than those corresponding to $\nu_1$ for the semiconductor, the area of high excess carrier concentration in the excited region 215 will have a lower index of refraction than will the nonexcited area of the ray deflector 200. Thus, by choosing a mask 213*a* of a desired configuration, an area of high excess carrier concentration of that configuration can be established within the semiconductor material 210. The ray deflector 200 may be used as a lens in order to defocus light rays 232, 234, 236 projected upon the face of the semiconductor material 210 as shown in FIG. 4*a*.

Figure 4B:
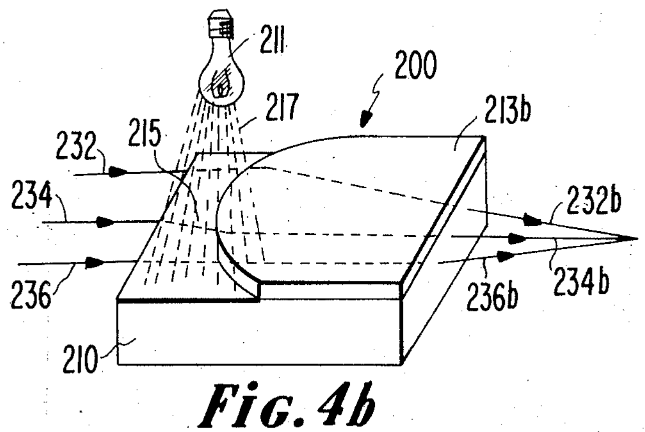

Similarly, as shown in FIG. 4b, the semiconductor ray deflector 200 can be given different characteristics by substituting a different mask 213*b* between the excitation generator 211 and the semiconductor material 210. As will be obvious to one skilled in the art of optics, masks may be constructed having such configurations as will be desired in order to produce lenses having the characteristic determined by such masks.

As will be obvious to one skilled in the art, instead of using a mask 213 the shape of the excited region 215 may be determined by the configuration of the excitation source 211. For example, a laser or an electron beam together with suitable focussing means can be used instead of the light 211 and mask 213 shown in FIGS. 4*a* and 4*b*.

I claim:

1. A semiconductor light ray deflector which comprises:

a. a block of semiconductor material which is transparent to light, said block having two opposite faces through which light can be transmitted; and b. means for introducing a controllable distribution of excess free carriers within said block of semiconductor material so as to cause a change in the refractive index within said block which in turn deflects said light ray as it traverses said block between said opposite faces.

2. The semiconductor light ray deflector of claim 1 in which said block of semiconductor material contains a first region and a second region, said first region having one conductivity type and said second region having a different conductivity type whereby a PN junction is formed between said first region and said second region, said first region having at least one contact and said second region having at least one contact.

3. The semiconductor light ray deflector of claim 2 in which said first region is partially divided into at least two parts by a groove extending into said first region, there being a contact on each part of said region.

4. The semiconductor light ray deflector of claim 2 comprising a pair of contacts on each of said first and said second regions.

5. The semiconductor light ray deflector of claim 1 in which said means for introducing a controllable distribution of excess free carriers comprises an electron beam which is projected upon a portion of said block of semiconductor material.

6. A semiconductor light ray deflector of claim 5 further comprising a mask between said block of semiconductor material and said electron beam, said mask having an opening through which the excitation beam is projected onto said semiconductor block, whereby the shape of the region containing said excess free carrier concentration is determined.

7. The semiconductor light ray deflector of claim 1 in which said means for introducing a controllable distribution of excess free carriers comprises a light beam having a photon energy greater than the semiconductor gap energy.

8. The semiconductor light ray deflector of claim 7 further comprising a mask between said block of semiconductor material and said light beam, said mask having an opening through which a portion of said light beam is projected onto said semiconductor block, whereby the configuration of said excess free carrier concentration within said semiconductor block is determined.

* * * * *

Disclaimer 3,790,853.—*Jacques Isaac Pankove*, Princeton, N.J. SEMICONDUCTOR LIGHT RAY DEFLECTOR. Patent dated Feb. 5, 1974. Disclaimer filed Sept. 7, 1976, by the assignee, *RCA Corporation*.

Hereby enters this disclaimer to claims 1, 2, 4 and 7 of said patent.

[*Official Gazette November 23, 1976.*]